US012641968B2

(12) United States Patent
Ren et al.

(10) Patent No.: US 12,641,968 B2
(45) Date of Patent: May 26, 2026

(54) DISPLAY PANEL HAVING OPTICAL FINGERPRINT REGION

(71) Applicant: Yungu (Gu'an) Technology Co., Ltd., Langfang (CN)

(72) Inventors: Qingrong Ren, Langfang (CN); Rubo Xing, Langfang (CN); Junfeng Li, Langfang (CN); Gang Wang, Langfang (CN); Rui Guo, Langfang (CN); Shuang Cui, Langfang (CN); Haofeng Zhang, Langfang (CN); Shiwen Hu, Langfang (CN)

(73) Assignee: YUNGU (GU'AN) TECHNOLOGY CO., LTD., Langfang (CN)

( * ) Notice: Subject to any disclaimer, the term of this patent is extended or adjusted under 35 U.S.C. 154(b) by 342 days.

(21) Appl. No.: 18/362,250

(22) Filed: Jul. 31, 2023

(65) Prior Publication Data

US 2023/0380226 A1    Nov. 23, 2023

Related U.S. Application Data

(63) Continuation of application No. PCT/CN2022/089346, filed on Apr. 26, 2022.

(30) Foreign Application Priority Data

Aug. 11, 2021    (CN) .......................... 202110919104.2

(51) Int. Cl.
  *H10K 59/126*    (2023.01)
  *H10K 59/122*    (2023.01)
  *H10K 59/65*    (2023.01)
(52) U.S. Cl.
  CPC ......... *H10K 59/126* (2023.02); *H10K 59/122* (2023.02); *H10K 59/65* (2023.02)

(58) Field of Classification Search
None
See application file for complete search history.

(56) References Cited

U.S. PATENT DOCUMENTS

2019/0213379 A1    7/2019  Zhao et al.
2020/0401781 A1    12/2020  Haddad et al.
  (Continued)

FOREIGN PATENT DOCUMENTS

CN    106547141 A    3/2017
CN    106681069 A    5/2017
  (Continued)

OTHER PUBLICATIONS

Office Action issued on Apr. 16, 2024, in corresponding Japanese Application No. 2023-545888, 10 pages.
  (Continued)

*Primary Examiner* — Nduka E Ojeh
(74) *Attorney, Agent, or Firm* — Maier & Maier, PLLC

(57)    ABSTRACT

A display panel. The display panel includes an optical fingerprint region which is provided with a light-blocking layer and a protection layer, and the light-blocking layer is provided with a plurality of through holes; the protection layer includes a filling part; the filling part fills parts of regions in the through holes, the filling part is disposed surrounding and closely fitting side walls of the through holes, and the protection layer further includes a light-transmitting part, a height of the light-transmitting part is greater than or equal to depths of the through holes, and an included angle formed between a bottom wall of the filling part and a side wall of the light-transmitting part is an acute angle; or, the filling part fills a whole region in the through hole, and a material of the filling part is a light-transmitting material.

18 Claims, 5 Drawing Sheets

(56) References Cited

U.S. PATENT DOCUMENTS

| | | | | |
|---|---|---|---|---|
| 2021/0408491 A1* | 12/2021 | Peng | ...................... | H10K 59/60 |
| 2022/0131018 A1* | 4/2022 | Jeon | ...................... | H10K 59/65 |
| 2023/0142687 A1* | 5/2023 | Ren | ...................... | H10K 59/60 257/40 |
| 2024/0260421 A1* | 8/2024 | Arakawa | ................ | H05B 33/04 |
| 2025/0081801 A1* | 3/2025 | Yan | ...................... | H10K 59/122 |

FOREIGN PATENT DOCUMENTS

| | | | |
|---|---|---|---|
| CN | 107025451 | A | 8/2017 |
| CN | 108922905 | A | 11/2018 |
| CN | 109273497 | A | 1/2019 |
| CN | 110161739 | A | 8/2019 |
| CN | 110265439 | A | 9/2019 |
| CN | 110277430 | A | 9/2019 |
| CN | 210574754 | U | 5/2020 |
| CN | 111312792 | A | 6/2020 |
| CN | 111668388 | A | 9/2020 |
| CN | 211427367 | U | 9/2020 |
| CN | 111814723 | A | 10/2020 |
| CN | 112071866 | A | 12/2020 |
| CN | 112232196 | A | 1/2021 |
| CN | 112379794 | A | 2/2021 |
| CN | 112736109 | A | 4/2021 |
| CN | 213211040 | U | 5/2021 |
| CN | 113594225 | A | 11/2021 |
| JP | 2022030129 | A | 2/2022 |
| KR | 1020190066433 | A | 6/2019 |
| KR | 1020200002155 | A | 1/2020 |
| KR | 1020210089820 | A | 7/2021 |
| WO | 2019218659 | A1 | 11/2019 |
| WO | 2021139010 | A1 | 7/2021 |

OTHER PUBLICATIONS

Office Action issued on Aug. 27, 2024, in corresponding Japanese Application No. 2023-545888, 6 pages.

International Search Report and Written Opinion issued on Jun. 17, 2022 in corresponding International application No. PCT/CN2022/089346; 15 pages.

Chinese Office Action issued on Jul. 14, 2022 in corresponding application No. 202110919104.2, 13 pages.

Chinese Office Action issued on Sep. 28, 2022 in corresponding application No. 202110919104.2, 14 pages.

Chinese Decsion on Rejection issued on Jan. 6, 2023 in corresponding application No. 202110919104.2, 6 pages.

Chinese Notice to Grant of Patent issued on Jun. 2, 2023 in corresponding application No. 202110919104.2, 7 pages.

Office Action issued on May 16, 2025, in corresponding Korean Application No. 1020237026167, 16 pages.

Notice of Allowance issued on Jan. 13, 2026, in corresponding Korean Application No. 10-2023-7026167, 3 pages.

* cited by examiner

DISPLAY PANEL HAVING OPTICAL FINGERPRINT REGION

CROSS-REFERENCE TO RELATED APPLICATIONS

The present application is a continuation of International Application No. PCT/CN2022/089346, filed on Apr. 26, 2022, which claims priority to Chinese Patent Application No. 202110919104.2, filed with China National Intellectual Property Administration on Aug. 11, 2021, and entitled "DISPLAY PANEL AND DISPLAY DEVICE". The disclosures of the aforementioned applications are hereby incorporated by reference in their entireties.

TECHNICAL FIELD

The present application relates to the technical field of displays, and in particular, to a display panel having an optical fingerprint region.

BACKGROUND

In order to obtain a larger screen ratio, under-screen optical fingerprint recognition technology is increasingly applied to a display device such as a mobile phone and a tablet computer. The under-screen optical fingerprint recognition technology is to dispose an optical fingerprint sensor on a back of a display panel of the display device, and light reflected by a finger above the display panel passes through the display panel and is received by the optical fingerprint sensor to conduct a fingerprint recognition.

In order to realize fingerprint recognition, the pinhole imaging principle is usually used to guide light to the optical fingerprint sensor. However, this may affect product quality of the display panel.

SUMMARY

In view of the above problems, embodiments of the present application provide a display panel and a display device, which can ensure the production quality of the display panel.

In order to achieve the above object, the embodiments of the present application provide the following technical solutions.

A first aspect of the embodiments of the present application provides a display panel, which includes an optical fingerprint region, the optical fingerprint region is provided with a light-blocking layer and a protection layer, and the light-blocking layer is provided with a plurality of through holes; the protection layer includes a filling part, and the filling part fills at least part of a region in the through hole; the filling part fills part of the region in the through hole, the filling part is disposed surrounding and closely fitting a side wall of the through hole, and the protection layer further includes a light-transmitting part, the filling part is located between the light-transmitting part and the side wall of the through hole, a height of the light-transmitting part is greater than or equal to a depth of the through hole, and an included angle formed between a bottom wall of the filling part and a side wall of the light-transmitting part is an acute angle; or, the filling part fills an entire region in the through hole, and a material of the filling part is a light-transmitting material.

The display panel provided in this embodiment of the present application has the optical fingerprint region, the light-blocking layer and the protection layer are disposed in the optical fingerprint region, and the light-blocking layer is provided with the through hole for pinhole imaging, and light reflected by a finger above the display panel passes through the through hole and enters an optical fingerprint sensor, to realize fingerprint recognition. The protection layer can fill the through hole without affecting the light transmission of the through hole, ensuring the integrity of functional layers disposed above the light-blocking layer and improving the product quality of the display panel.

A second aspect of the embodiments of the present application provides a display panel, which includes an optical fingerprint region; a substrate; a pixel defining layer including a light-blocking layer disposed in the optical fingerprint region, a protection layer disposed in the optical fingerprint region and a plurality of pixel openings; a plurality of pixel units disposed in the pixel openings of pixel defining layer; a planarization layer disposed in a side of the pixel defining layer close to the substrate; where the light-blocking layer is disposed between adjacent ones of the pixel units and provided with a plurality of through holes; and the protection layer is disposed between adjacent ones of the pixel units and includes a filling part and the filling part fills at least part of the through holes of the light-blocking layer; where the filling part fills parts of regions in the through holes, the filling part is disposed surrounding and closely fitting side walls of the through holes, and the protection layer further includes a light-transmitting part, the filling part is located between the light-transmitting part and the side walls of the through holes, a height of the light-transmitting part is greater than or equal to depths of the through holes, and an included angle formed between a bottom wall of the filling part and a side wall of the light-transmitting part is an acute angle.

A cross-sectional shape of the light-transmitting part in a plane perpendicular to the display panel is a trapezoid, and a length of a top edge of the trapezoid is greater than a length of a bottom edge of the trapezoid.

DETAILED DESCRIPTION OF EMBODIMENTS

In the related art, in order to make more light reflected by a finger enter an optical fingerprint sensor, a light-blocking layer is added in an array substrate of a display panel, and small holes are disposed in a region of the light-blocking layer corresponding to the optical fingerprint sensor, and more light reflected by the finger above the display panel is guided to the optical fingerprint sensor by using a pinhole imaging principle.

However, in the above solution, the arrangement of the small holes may affect the integrity of functional layers above the light-blocking layer, and thus affect the product quality of the display panel.

In view of the above technical problems, an embodiment of the present application provides a display panel, where a through hole for pinhole imaging is formed on a light-blocking layer, and a protection layer is configured to fill the through hole without affecting the light transmission of the through hole, thereby ensuring the integrity of the functional layers disposed on the light-blocking layer and improving the product quality of the display panel.

In order to make the above object, features and advantages of the embodiments of the present application more obvious and understandable, the technical solutions in embodiments of the present application will be described clearly and completely with reference to the accompanying drawings of the embodiments of the present application. Obviously, the described embodiments are only some but not all of the embodiments of the present application. Based on the embodiments in the present application, all other embodiments obtained by those ordinary skilled in the art without creative labor belong to the protection scope of the present application.

Figure 1:
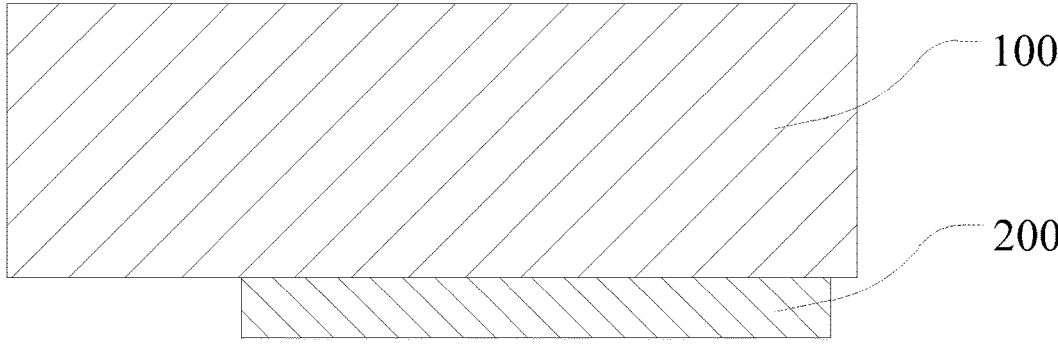
FIG. 1 is a cross-sectional view of a display device provided in an embodiment of the present application.

Referring to FIG. 1, a display device provided by an embodiment of the present application includes a display panel 100 and an optical fingerprint sensor 200 disposed on back of the display panel 100. Where the display panel 100 is usually used for displaying information such as images and realizing a touch control function, and the display panel 100 may be, for example, an OLED (Organic Light-Emitting Diode) display panel; the optical fingerprint sensor 200 is configured to receive light reflected or refracted by the finger to realize fingerprint recognition.

Figure 2:
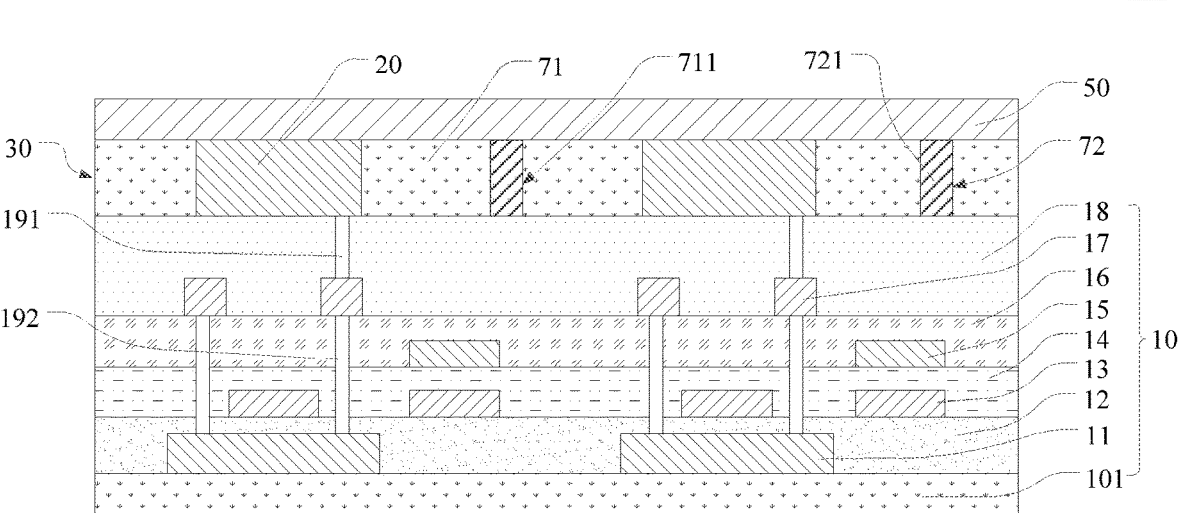
FIG. 2 is a cross-sectional view of a display panel provided in an embodiment of the present application.

As shown in FIG. 2, the display panel 100 includes an array substrate 10, a plurality of pixel units 20 disposed on the array substrate 10, a pixel definition layer 30 for separating the pixel units 20 and an encapsulation layer 50 for covering the pixel units 20. When a fingerprint recognition is needed, after light emitted by the pixel units 20 in the display panel 100 is irradiated to a finger placed on the display panel 100, light reflected or refracted by the finger passes through the display panel 100 and is received by the optical fingerprint sensor 200 for to conduct the fingerprint recognition.

With continued reference to FIG. 2, the array substrate 10 includes a substrate 101 and an active layer 11, a first insulation layer 12, a first metal layer 13, a second insulation layer 14, a second metal layer 15, a third insulation layer 16, a third metal layer 17 and a planarization layer 18 laminated on the substrate 101. The first metal layer 13 includes a gate electrode of a thin film transistor and a first electrode plate of a capacitor, the second metal layer 15 includes a second electrode plate of the capacitor, the third metal layer 17 includes source and drain electrodes of the thin film transistor, the source and drain electrodes are connected to the pixel unit 20 through a first wire 191, and the source and drain electrodes are connected to the active layer 11 through a second wire 192.

In an implementation, the active layer 11 may be made of amorphous silicon (a-Si), polycrystalline silicon (poly-Si), organic semiconductor and the like. The first insulation layer 12, the second insulation layer 14 and the third insulation layer 16 may be inorganic material layers made of materials such as silicon oxide and silicon nitride. The planarization layer 18 may be an organic material layer made of a material such as resin. The first metal layer 13, the second metal layer 15 and the third metal layer 17 may be metal film layers made of metals such as molybdenum and titanium.

The pixel definition layer 30 is disposed on the planarization layer 18 of the array substrate 10, and the pixel definition layer 30 is provided with a plurality of pixel openings, and the pixel units 20 are located in the pixel openings.

Figure 3:
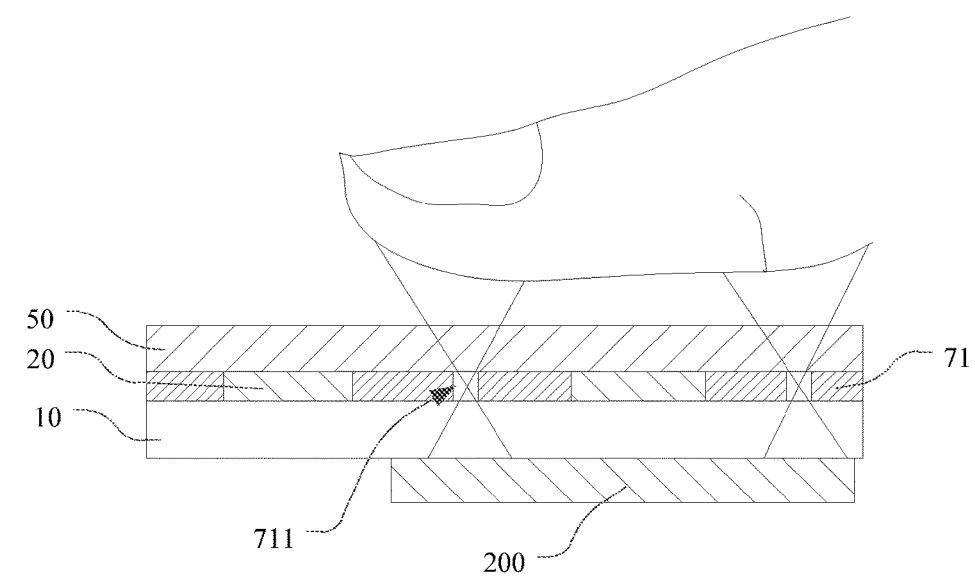
FIG. 3 is a schematic diagram of an imaging principle of the display panel as shown in FIG. 2.

The display panel 100 has an optical fingerprint region, and the optical fingerprint region is provided with a light-blocking layer 71, the light-blocking layer 71 is provided with a plurality of through holes 711, and the plurality of through holes 711 are used for pinhole imaging. As shown in FIG. 3, during fingerprint recognition, a finger is placed on the display panel 100, and light reflected or refracted by the finger passes through the through hole 711, and then passes through the display panel 100 and enters into the optical fingerprint sensor 200, and since light travels along a straight line, according to the pinhole imaging principle, an image of the finger forms an inverted image on the optical fingerprint sensor 200 through the through hole 711.

A size of the through hole 711 is not particularly limited, and it may be set according to an optical principle of pinhole imaging, as long as the pinhole imaging can be realized and more light reflected by the finger may be guided to the optical fingerprint sensor 200. For example, in an embodiment, if a plane parallel to the display panel 100 is taken as a cross section, then a shape of the through hole 711 is a circular hole, and the circular hole has a diameter of 5 μm-20 μm, so as to ensure the clarity of a virtual image formed on the optical fingerprint sensor 200 and improve the recognition effect of the optical fingerprint sensor 200. Of course, it may be understood that the shape of the through hole 711 is not limited to the above circular hole, but may also be other shapes such as an elliptical hole and a square hole.

The optical fingerprint region further includes a protection layer 72, which is configured to fill the through hole 711 without affecting the light transmission of the through hole 711, so as to ensure the integrity of the functional layers above the light-blocking layer 71. The protection layer 72 includes a filling part 721 that fills at least part of a region of the through hole 711. In some embodiments, as shown in FIG. 2, a material of the filling part 721 is a light-transmitting material, and the filling part 721 fills entire regions in the through hole 711, thus ensuring the integrity of the functional layers above the light-blocking layer 71, for example, effectively avoiding the cathode from being disconnected, and thus ensuring the product quality of the display panel 100.

In other embodiments, the filling part 721 may also fill part of the region in the through hole 711. For example, in the embodiment shown in FIG. 5, the filling part 721 is disposed surrounding and closely fitting a side wall of the through hole 711, and the protection layer 72 further includes a light-transmitting part 723, the filling part 721 is located between the light-transmitting part 723 and the side wall of the through hole 711, a height of the light-transmitting part 723 is greater than or equal to a depth of the through hole 711, and an included angle formed between a bottom wall of the filling part 721 and a side wall of the light-transmitting part 723 is an acute angle.

In the above embodiment, the light transmission of the through hole 711 is ensured by the light-transmitting part 723, and the filling part 721 is disposed between the light-transmitting part 723 and the side wall of the through hole 711, and the included angle formed between the bottom wall of the filling part 721 and the side wall of the light-transmitting part 723 is an acute angle, so that no filling dead corner is not formed on an inner side of a bottom of the filling part 721, it is ensured that when a functional layer above the light-blocking layer 71 is formed, the functional layer can be continuous in a region where an inner side wall and the bottom wall of the filling part 721 meets, so that the integrity of each functional layer formed on the light-blocking layer 71 may be ensured, which may, for example, effectively avoid cathode wire-disconnection phenomenon, and thus ensure the product quality of the display panel 100.

A material of the light-blocking layer 71 may be any material with light blocking function, for example, it may be a black resin material layer. In order to improve the light blocking effect of the light-blocking layer 71, the light-blocking layer 71 is a black matrix material layer, and a material of the black matrix material layer may be a negative photoresist containing chromium or carbon black. The light-blocking layer 71 made of the black matrix material layer may improve the light blocking effect of the light-blocking layer 71, thereby improving a signal-to-noise ratio of optical signals entering the optical fingerprint sensor 200 and ensuring the yield of the display panel 100.

Figure 4:
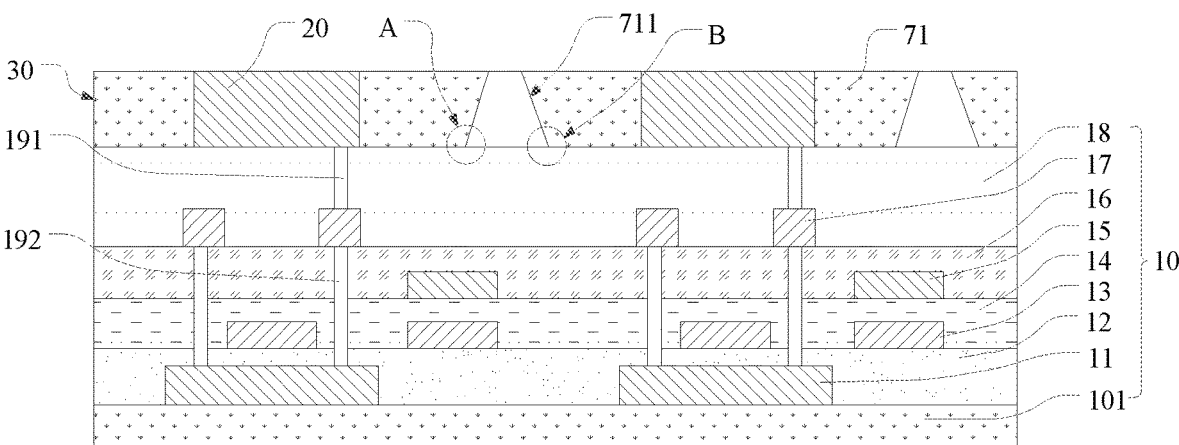
FIG. 4 is a cross-sectional view of a display panel provided in another embodiment of the present application.

In the embodiment where the light-blocking layer 71 is the black matrix material layer, the through hole 711 are formed on the light-blocking layer 71 by a photolithography process. However, when the through hole 711 is formed on the black matrix material layer by the photolithography process, due to the characteristics of the black matrix material layer itself, as shown in FIG. 4, a shape of the formed through holes 711 is as follows: a cross-sectional shape in a plane perpendicular to the pixel definition layer 30 is a regular trapezoid, i.e., a shape of upper narrow and lower wide. The through hole 711 in a shape of upper narrow and lower wide may affect the integrity of the functional layers of the integrated structures formed on the light-blocking layer 71.

Figure 6:
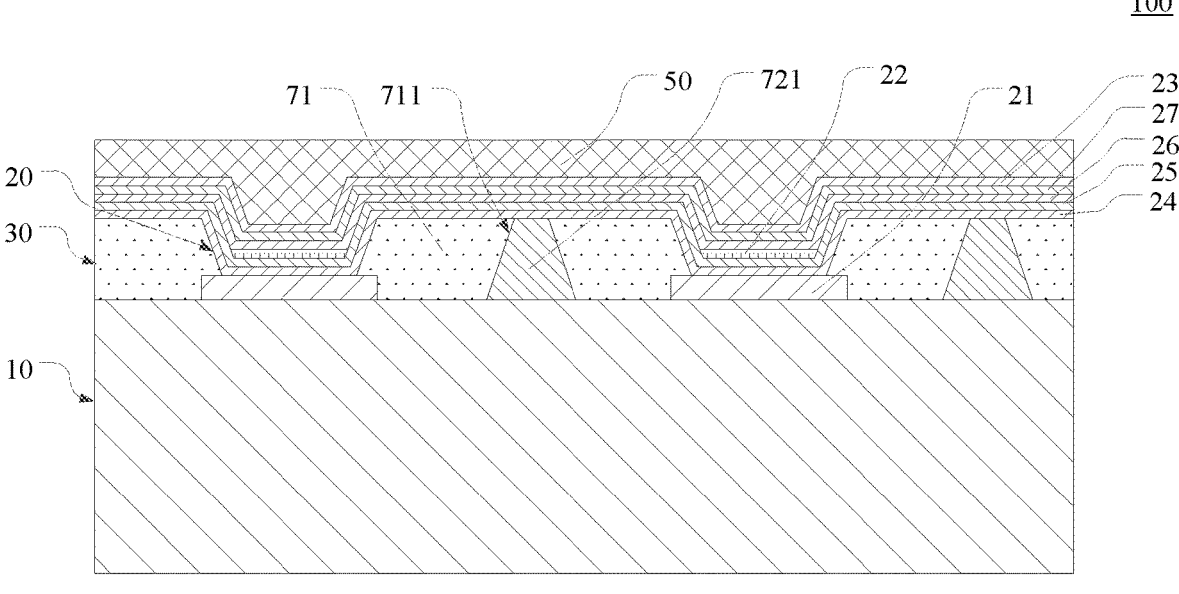
FIG. 6 is a cross-sectional view of a display panel provided in another embodiment of the present application.

The following is taking a display panel shown in FIG. 6 as an example, to explain reasons for the above problem in detail. As shown in FIG. 6, each pixel unit 20 includes a first electrode 21, a light-emitting material layer 22 and a second electrode 23. In order to facilitate wiring and simplify a circuit, the second electrodes 23 are located on the pixel definition layer 30, and the second electrodes 23 have an integrated structure, that is, the second electrodes 23 form a second electrode layer as a complete (i.e., continuous) layer. Where the first electrode 21 is an anode, and the second electrode 23 is a cathode.

With further reference to FIG. 6, the pixel unit 20 further includes a hole injection layer 24, a hole transport layer 25, an electron transport layer 26 and an electron injection layer 27. The hole injection layer 24 is located on the first electrode 21 as the anode, and the hole transport layer 25 is located on a side of the hole injection layer 24 away from the first electrode 21, a function of the hole injection layer 24 is to improve an energy level matching between the anode layer and the hole transport layer 25 in the pixel unit 20. In general, a material for preparation of the anode layer is an indium tin oxide (Indium Tin Oxide, ITO) layer, and an energy level of a material of the commonly used hole transport layer 25 does not match with an energy level of the ITO layer, resulting in decreased hole transport efficiency. By setting the hole injection layer 24, an injection barrier between the anode layer and the hole transport layer 25 can be reduced, to assist injection of holes from the ITO layer into the hole transport layer 25. Likewise, the electron injection layer 27 may improve the energy level matching between a cathode layer and the electron transport layer 26.

The hole injection layers 24 of the pixel units 20 may be disposed apart from each other or formed into an integrated structure. Similarly, the hole transport layers 25 of the pixel units 20 may also be disposed apart from each other or formed into an integrated structure; the electron transport layers 26 of the pixel units 20 may also be disposed apart from each other or formed as an integrated structure; and the electron injection layers 27 of the pixel units 20 may also be disposed apart from each other or formed as an integrated structure.

Figure 5:
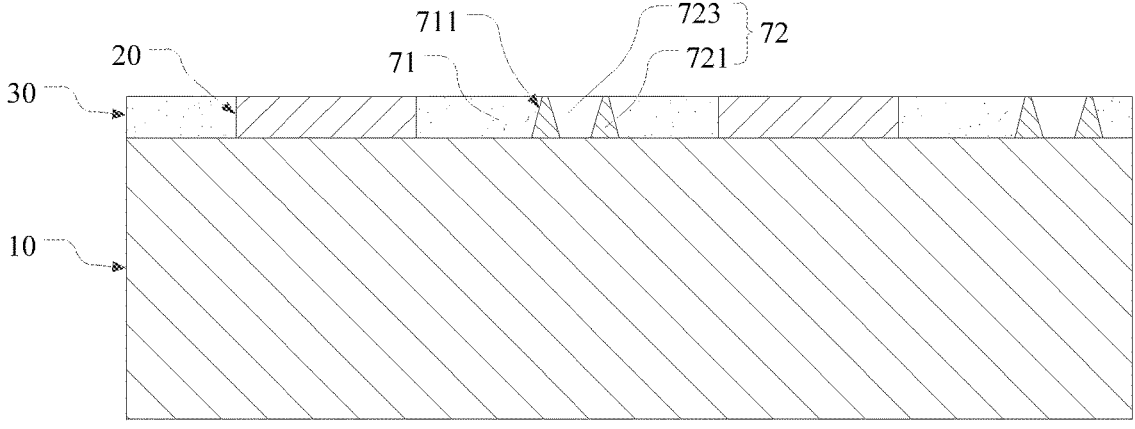
FIG. 5 is a cross-sectional view of a display panel provided in another embodiment of the present application.

In the above embodiment, the second electrodes 23 are an integrated structure, and the shape of the through hole 711 is a regular trapezoid. In a preparation process of the second electrode 23, it is difficult for a material forming the second electrode 23 to fill a bottom corner region of the regular trapezoid, which results in existence of filling dead corners in the through hole 711 (such as region A and region B in FIG. 4), and then results in breakage of the second electrode 23 or disconnection of a wire connected to the second electrode 23, thereby affecting the display of the display panel 100. As shown in FIG. 5 and FIG. 6, since the filling part 721 is provided to fill at least part of the region of the through hole 711, so that in the preparation process of the second electrode 23, the continuity of the second electrode 23 can be ensured, to avoid the disconnection of the wire and ensure the normal display of the display panel 100, further improving the yield of the display panel 100.

In an embodiment where the filling part 721 fills a whole region of the through hole 711, the filling part 721 may be any material that can ensure light to pass through the through hole 711. For example, a material of the filling part 721 may be a transparent resin material, which may fill the whole region of the through hole 711 by spin coating, evaporation and the like. Since the transparent resin material has good fluidity, it may better fill the through hole 711. Preferably, an upper surface of the filling part 721 is flush with an upper surface of the light-blocking layer 71, thereby further improving the integrity of the functional layers above the light-blocking layer 71. While in an embodiment where the filling part 721 fills part of the region of the through hole 711, since a light-transmitting part 723 is also disposed inside the filling part 721 and used to ensure the light-transmitting property of the through hole 711, the material of the filling part 721 is not limited. For example, the filling part 721 may use a light-transmitting material such as a transparent resin material, or a non-light-transmitting material such as a black resin material.

In an embodiment where the filling part 721 fills part of the region of the through hole 711, a specific shape of the light-transmitting part 723 is not limited, as long as an included angle formed between a side wall of the light-transmitting part 723 and a bottom wall of the filling part 721 is an acute angle. In an embodiment, as shown in FIG. 5, a cross-sectional shape of the light-transmitting part 723 in a plane perpendicular to the display panel 100 is trapezoid, and a length of a top edge of the trapezoid is greater than a length of a bottom edge of the trapezoid, this design makes an inner side wall of the filling part 721 adapted to the light-transmitting part 723 be a relatively flat surface, thereby ensuring that a film layer formed on the filling part 721 is well attached to the inner side wall of the filling part 721, further improving the product quality. In addition, the light-transmitting part 723 is set in the above shape, which makes it easy to be processed, thereby reducing the production cost and improving the production efficiency (described in detail later).

The light-transmitting part 723 may be set as a light-transmitting hole, that is, a cross-sectional shape of the light-transmitting hole in the plane perpendicular to the display panel 100 is a trapezoid, and a length of a top edge of the trapezoid is greater than a length of a bottom edge of the trapezoid. In this embodiment, since the light-transmitting hole is in a shape of upper wide and lower narrow, no filling dead corner is formed in a bottom region of the light-transmitting hole, so that the functional layers formed on the protection layer 72 may remain continuous in a region where the side wall and the bottom wall of the light-transmitting hole meet, thereby ensuring the integrity of the functional layers and improving the product quality of the display panel 100.

In the above embodiment, a material of the filling part 721 may be a light-transmitting material, such as a transparent resin material, or the material of the filling part 721 may be a black resin material, such as polyimide or polymethyl methacrylate containing a black colorant. The arrangement of the light-transmitting hole may ensure the light transmission of the through hole 711, and thus ensure that enough light passes through the through hole 711 and is received by the optical fingerprint sensor 200, thereby improving the recognition effect of the optical fingerprint sensor 200.

In the above embodiment, when the filling part 721 is made of a transparent resin material or a black resin material, the above light-transmitting hole may be formed on the filling part 721 by a photolithography process. Due to the material characteristics of the resin material itself, the cross-sectional shape of the light-transmitting hole formed by the photolithography process in the plane perpendicular to the display panel 100 is a trapezoid, and the length of the top edge of the trapezoid is greater than the length of the bottom edge of the trapezoid, thereby simplifying the processing technology.

Of course, it may be understood that the light-transmitting part 723 may also be provided as a light-transmitting material that fills an inner space of the filling part 721, which can ensure the flatness of the functional layers above the protection layer 72 and further improve the product quality of the display panel 100. In this embodiment, the filling part 721 may be a light-transmitting material or a non-light-transmitting material. In an embodiment, the filling part 721 is a black resin material, and the light-transmitting part 723 is a film layer formed by a light-transmitting material. By setting the filling part 721 as a black resin material, light around the light-transmitting part 723 can be better blocked, so as to better remove stray light, improve a signal-to-noise ratio of optical signals entering the optical fingerprint sensor 200, and thus improve a fingerprint recognition effect of the optical fingerprint sensor 200.

Exemplarily, along a direction away from the substrate 101, an area of an orthographic projection of the filling part 721 on the substrate 101 is gradually decreased, and the through hole 711 is in a shape of upper narrow and lower wide, so as to facilitate the processing of the through hole 711. For example, the through hole 711 is formed by a photolithography process on the light-blocking layer 71, and the filling part 721 is disposed such that the area of the orthographic projection of the filling part 721 on the substrate 101 is gradually decreased along the direction away from the substrate 101, thereby filling an edge region at the bottom of the through hole 711, and making the included angle formed by the bottom wall of the filling part 721 and the side wall of the light-transmitting part 723 be an acute angle.

Figure 7:
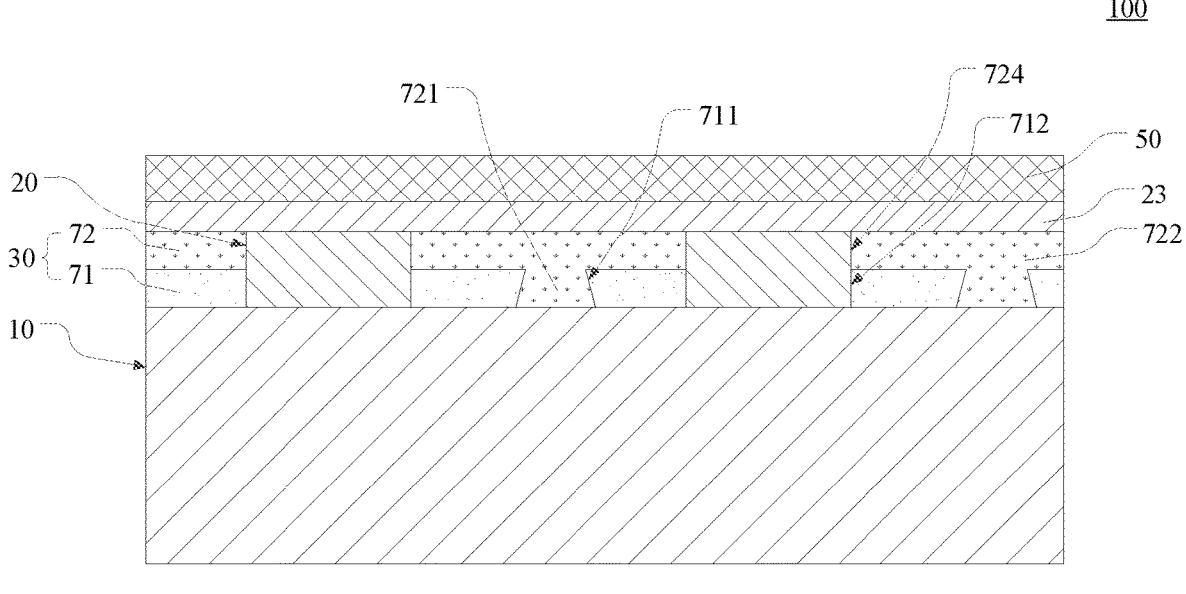
FIG. 7 is a cross-sectional view of a display panel provided in another embodiment of the present application.
Figure 8:
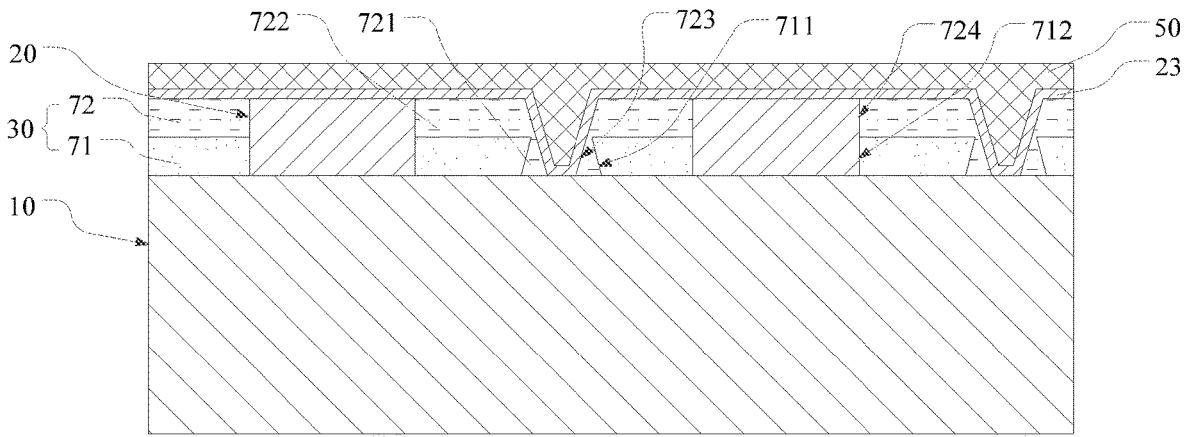
FIG. 8 is a cross-sectional view of a display panel provided in another embodiment of the present application.

As shown in FIG. 7 and FIG. 8, the protection layer 72 further includes a protection part 722 connected with the filling part 721, the protection part 722 covers the light-blocking layer 71, and the protection part 722 may form a good protective effect on the light-blocking layer 71. Preferably, the filling part 721 and the protection part 722 may be an integrated structure, thereby simplifying the structure and the processing technology, and improving the production efficiency of the display panel 100.

The protection part 722 may partially cover the light-blocking layer 71, and preferably, an orthographic projection of the protection part 722 on a plane parallel to the display panel 100 is larger than an orthographic projection of the light-blocking layer 71 on the plane parallel to the display panel 100, this design can ensure that the protection part 722 completely covers the light-blocking layer 71, thereby improving the flatness of the functional layers above the protection layer 72. In addition, since the protection layer 72 has a complete (i.e., continuous) layer structure, which can simplify the preparation process of the protection layer 72, reduce the production cost, and improve the production efficiency.

The protection part 722 may be a light-transmitting material, or may be a material with a certain light-blocking effect, for example, a black resin material. The black resin material may be polyimide or polymethyl methacrylate containing a black colorant. By using the black resin material as the protection part 722, the light-blocking effect of the protection layer 72 can be improved, thereby further improving the signal-to-noise ratio of optical signals entering the optical fingerprint sensor 200, and thus improving the fingerprint recognition effect of the optical fingerprint sensor 200. When the protection part 722 is made of the black resin material, the light-transmitting part 723 penetrates through the protection part 722 in order to ensure the light transmission of the through hole 711.

The light-blocking layer 71 and the protection layer 72 in the above embodiment may be disposed at any position in the display panel 100. In an embodiment, as shown in FIG. 7 and FIG. 8, the light-blocking layer 71 and the protection layer 72 form the pixel definition layer 30, and the pixel definition layer 30 formed by the light-blocking layer 71 and the protection layer 72 is provided with a pixel opening 724, which penetrates through the light-blocking layer 71 and the protection layer 72, and the through hole 711 is disposed between the pixel openings 724. In this design, there is no need to additionally dispose the pixel definition layer 30, which simplifies the structure and processing technology of the display panel 100, and reduces the production cost of the display panel 100.

Figure 9:
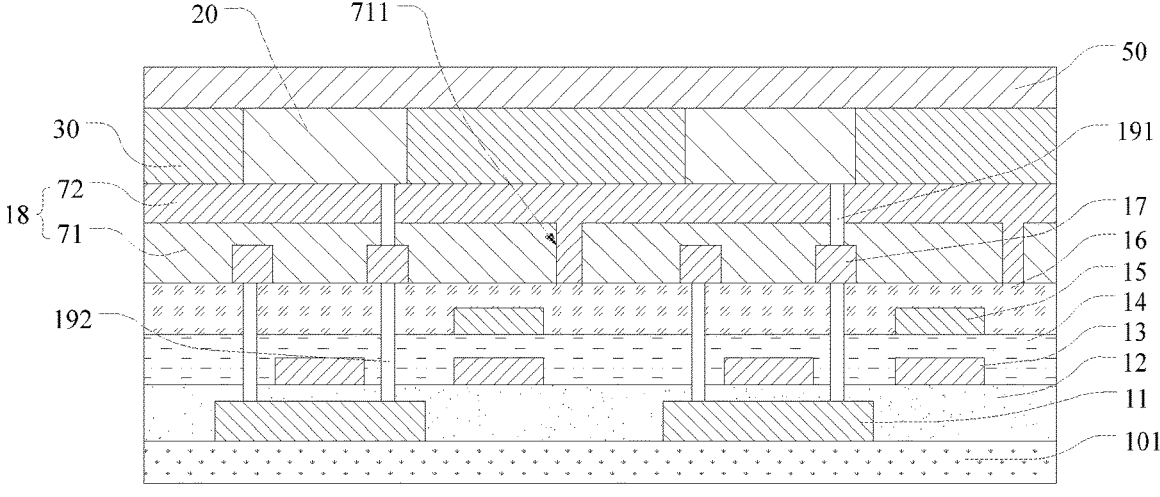
FIG. 9 is a cross-sectional view of a display panel provided in another embodiment of the present application.

It may be understood that the light-blocking layer 71 and the protection layer 72 are not limited to forming the pixel definition layer 30, and in an embodiment, the light-blocking layer 71 and the protection layer 72 form the planarization layer 18. For example, as shown in FIG. 9, an array substrate 10 includes a substrate 101, and an active layer 11, a first insulation layer 12, a first metal layer 13, a second insulation layer 14, a second metal layer 15, a third insulation layer 16 and a third metal layer 17 laminated on the substrate 101, where the light-blocking layer 71 covers the third metal layer 17, and a through hole 711 for pinhole imaging is provided on the light-blocking layer 71, and the protection part 722 of the protection layer 72 covers the light-blocking layer 71, and the filling part 721 of the protection layer 72 fills the through hole 711.

The first metal layer 13 includes a gate electrode of a thin film transistor and a first electrode plate of a capacitor, the second metal layer 15 includes a second electrode plate of the capacitor, and the third metal layer 17 includes source and drain electrodes of the thin film transistor, the source and drain electrodes are connected to the pixel unit 20 through a first wire 191, and the source and drain electrodes are connected to the active layer 11 through a second wire 192.

In the above embodiment, the light-blocking layer 71 and the protection layer 72 together form the planarization layer 18. The pixel definition layer 30 and the pixel unit 20 are disposed on the light-blocking layer 71. In this design, the processing technology of the display panel 100 may also be simplified, and when the fingerprint recognition is conducted, the light-blocking layer 71 is far away from the finger, so that more light reflected by the finger can enter the optical fingerprint sensor 200, and the recognition effect of the optical fingerprint sensor 200 is improved.

Figure 10:
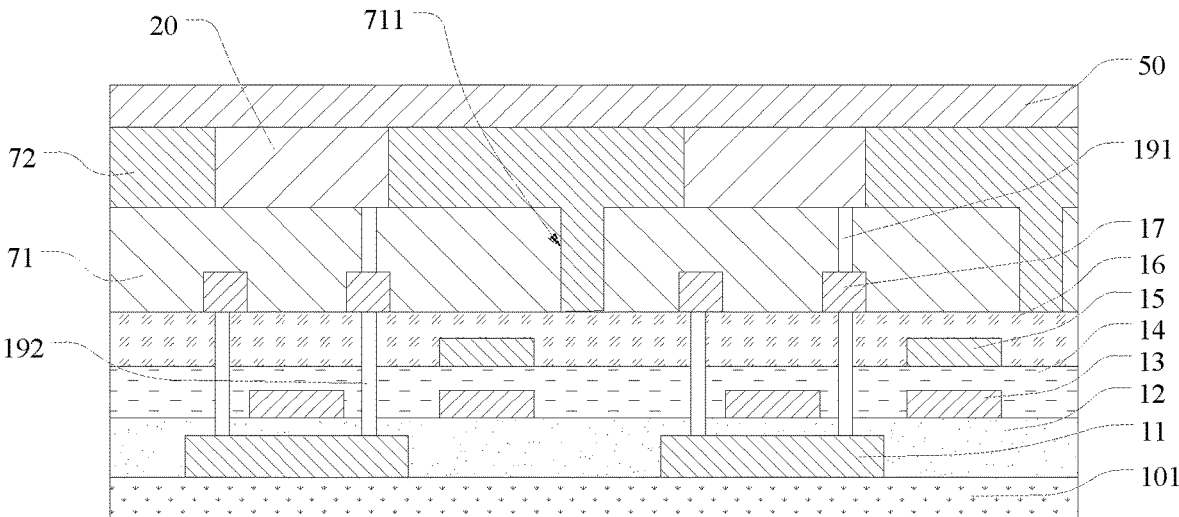
FIG. 10 is a cross-sectional view of a display panel provided in another embodiment of the present application.

In another embodiment, the light-blocking layer 71 forms the planarization layer 18, and the protection layer 72 forms the pixel definition layer 30. For example, as shown in FIG. 10, an array substrate 10 includes a substrate 101 and an active layer 11, a first insulation layer 12, a first metal layer 13, a second insulation layer 14, a second metal layer 15, a third insulation layer 16 and a third metal layer 17 laminated on the substrate 101, where a light-blocking layer 71 covers the third metal layer 17, and a through hole 711 for pinhole imaging is disposed on the light-blocking layer 71.

The first metal layer 13 includes a gate electrode of a thin film transistor and a first electrode plate of a capacitor, the second metal layer 15 includes a second electrode plate of the capacitor, and the third metal layer 17 includes source and drain electrodes of the thin film transistor, the source and drain electrodes are connected to the pixel unit 20 through a first wire 191, and the source and drain electrodes are connected to the active layer 11 through a second wire 192.

A protection part 722 of the protection layer 72 covers the light-blocking layer 71, and the pixel definition layer 30 formed by the protection part 722 is provided with a pixel opening. The filling part 721 of the protection layer 72 fills the through hole 711. In this design, the light-blocking layer 71 forms the planarization layer 18, and the protection layer 72 forms the pixel definition layer 30, which can simplify the processing technology of the display panel 100, meanwhile, since the light-blocking layer 71 as the planarization layer 18 has a large thickness, the blocking effect of the light-blocking layer 71 on light is improved and then the signal-to-noise ratio of optical signals entering the optical fingerprint sensor 200 is improved.

An embodiment of the present application provides a display device, which includes the display panel mentioned above and an optical fingerprint sensor disposed on back of the display panel, where the optical fingerprint sensor corresponds to an optical fingerprint region.

Since the display device includes the above display panel, the display device has the same advantages as the display panel, and the details may refer to the above description.

Finally, it should be noted that the above embodiments are merely intended for describing the technical solutions of the present application other than limiting them; although the present application is described in detail with reference to the foregoing embodiments, those ordinary skilled in the art should understand that they may still make modifications to the technical solutions described in the foregoing embodiments or make equivalent substitutions to part or all of the technical features therein; and these modifications or substitutions do not make the essence of corresponding technical solutions depart from the scope of the technical solutions of the embodiments of the present application.

What is claimed is:

1. A display panel, comprising:
an optical fingerprint region;
a light-blocking layer disposed in the optical fingerprint region and provided with a plurality of through holes; and
a protection layer disposed in the optical fingerprint region and comprising a filling part;
wherein the filling part fills parts of regions in the through holes, the filling part is disposed surrounding and closely fitting side walls of the through holes, and the protection layer further comprises a light-transmitting part, the filling part is located between the light-transmitting part and the side walls of the through holes, a height of the light-transmitting part is greater than or equal to depths of the through holes, and an included angle formed between a bottom wall of the filling part and a side wall of the light-transmitting part is an acute angle; and
wherein the protection layer further comprises a protection part connected with the filling part, and the protection part covers the light-blocking layer.

2. The display panel according to claim 1, wherein the light-blocking layer comprises a black matrix material layer, and cross-sectional shapes of the through holes in a plane perpendicular to the display panel are a regular trapezoid.

3. The display panel according to claim 2, wherein the black matrix material layer comprises a negative photoresist containing chromium or carbon black.

4. The display panel according to claim 1, wherein the filling part fills the parts of the regions of the through holes, a cross-sectional shape of the light-transmitting part in a plane perpendicular to the display panel is a trapezoid, and a length of a top edge of the trapezoid is greater than a length of a bottom edge of the trapezoid.

5. The display panel according to claim 4, wherein the light-transmitting part is a light-transmitting hole, and the filling part comprises a black resin material or a light-transmitting material;
or, the light-transmitting part is a film layer formed by a light-transmitting material, and the filling part is the black resin material.

6. The display panel according to claim 5, further comprising an array substrate, the array substrate comprises a substrate, and an area of an orthographic projection of the filling part on the substrate is gradually decreased along a direction away from the substrate.

7. The display panel according to claim 5, wherein the black resin material comprises polyimide or polymethyl methacrylate containing a black colorant.

8. The display panel according to claim 1, wherein an orthographic projection of the protection part on a substrate of the display panel is larger than an orthographic projection of the light-blocking layer on the substrate.

9. The display panel according to claim 1, wherein the display panel comprises a substrate, a planarization layer at a side of the substrate, and a pixel definition layer at a side of the planarization layer away from the substrate; and the light-blocking layer and the protection layer form the pixel definition layer.

10. The display panel according to claim 1, further comprising a substrate, a planarization layer at a side of the substrate, and a pixel definition layer at a side of the planarization layer away from the substrate; and the light-blocking layer forms the planarization layer, and the protection layer forms the pixel definition layer.

11. A display panel, comprising:

an optical fingerprint region;

a light-blocking layer disposed in the optical fingerprint region and provided with a plurality of through holes; and a protection layer disposed in the optical fingerprint region and comprising a filling part;

wherein the filling part fills whole regions in the through holes, and a material of the filling part is a light-transmitting material; and wherein the protection layer further comprises a protection part connected with the filling part, and the protection part covers the light-blocking layer.

12. The display panel according to claim 11, wherein the light-blocking layer comprises a black matrix material layer, and cross-sectional shapes of the through holes in a plane perpendicular to the display panel are a regular trapezoid.

13. The display panel according to claim 12, wherein the black matrix material layer comprises a negative photoresist containing chromium or carbon black.

14. The display panel according to claim 11, wherein an orthographic projection of the protection part on a substrate of the display panel is larger than an orthographic projection of the light-blocking layer on the substrate.

15. The display panel according to claim 11, wherein the display panel comprises a substrate, a planarization layer at a side of the substrate, and a pixel definition layer at a side of the planarization layer away from the substrate; and the light-blocking layer and the protection layer form the pixel definition layer.

16. The display panel according to claim 11, wherein the display panel comprises a substrate, a planarization layer at a side of the substrate, and a pixel definition layer at a side of the planarization layer away from the substrate; and the light-blocking layer forms the planarization layer, and the protection layer forms the pixel definition layer.

17. A display panel, comprising:

an optical fingerprint region;

a substrate;

a pixel defining layer comprising a light-blocking layer disposed in the optical fingerprint region, a protection layer disposed in the optical fingerprint region, and a plurality of pixel openings;

a plurality of pixel units disposed in the pixel openings of pixel defining layer;

a planarization layer disposed in a side of the pixel defining layer close to the substrate;

wherein the light-blocking layer is disposed between adjacent ones of the pixel units and provided with a plurality of through holes; and the protection layer is disposed between adjacent ones of the pixel units and comprises a filling part, and the filling part fills at least part of the through holes of the light-blocking layer;

wherein the filling part fills parts of regions in the through holes, the filling part is disposed surrounding and closely fitting side walls of the through holes, and the protection layer further comprises a light-transmitting part, the filling part is located between the light-transmitting part and the side walls of the through holes, a height of the light-transmitting part is greater than or equal to depths of the through holes, and an included angle formed between a bottom wall of the filling part and a side wall of the light-transmitting part is an acute angle; and wherein the protection layer further comprises a protection part connected with the filling part, and the protection part covers the light-blocking layer.

18. The display panel according to claim 17, wherein a cross-sectional shape of the light-transmitting part in a plane perpendicular to the display panel is a trapezoid, and a length of a top edge of the trapezoid is greater than a length of a bottom edge of the trapezoid.

* * * * *